United States Patent
Wang et al.

(10) Patent No.: US 6,593,244 B1
(45) Date of Patent: Jul. 15, 2003

(54) PROCESS FOR ETCHING CONDUCTORS AT HIGH ETCH RATES

(75) Inventors: Yiqiong Wang, San Jose, CA (US); Anisul Khan, Sunnyvale, CA (US); Ajay Kumar, Sunnyvale, CA (US); Dragan Podlesnik, Palo Alto, CA (US); Sharma V. Pamarthy, Hayward, CA (US)

(73) Assignee: Applied Materials Inc., Santa Clara, CA (US)

( * ) Notice: Subject to any disclaimer, the term of this patent is extended or adjusted under 35 U.S.C. 154(b) by 0 days.

(21) Appl. No.: 09/659,072

(22) Filed: Sep. 11, 2000

(51) Int. Cl.⁷ .............................................. H01L 21/302
(52) U.S. Cl. .................. 438/706; 438/710; 438/712; 438/714; 438/720
(58) Field of Search .................. 438/706, 710, 438/712, 714, 720; 156/345; 216/67, 79

(56) References Cited

U.S. PATENT DOCUMENTS

| | | | | |
|---|---|---|---|---|
| 5,498,312 A | * | 3/1996 | Laermer et al. | 156/345 |
| 5,501,893 A | | 3/1996 | Laermet et al. | 428/161 |
| 5,591,268 A | * | 1/1997 | Usui et al. | 118/723 |
| 5,807,787 A | * | 9/1998 | Fu et al. | 438/623 |
| 6,071,822 A | * | 6/2000 | Donohue et al. | 438/712 |
| 6,096,160 A | * | 8/2000 | Kadomura | 156/345 |

FOREIGN PATENT DOCUMENTS

| | | | | |
|---|---|---|---|---|
| EP | 0 497023 A1 | 8/1992 | | H01L/21/306 |
| EP | 0 363982 B1 | 1/1997 | | H01L/21/306 |

OTHER PUBLICATIONS

Rangelow, "High resolution tri–level process by downstream RF biased etching", SPIE vol. 1392, Advanced Techniques for Integrated Circuit Processing (1990) pp 180–184.

Tsujimoto et al, "A New Side Wall Protection Technique in Microwave Plasma Etching Using a Chopping Method", Extended Abstracts of 18th Conf. on Solid State Devices and Materials, Bus Center Acad. Soc. Japan, 1986, pp 229–232.

* cited by examiner

*Primary Examiner*—Benjamin L. Utech
*Assistant Examiner*—Lan Vinh
(74) *Attorney, Agent, or Firm*—Birgit Morris; Joseph Bach

(57) ABSTRACT

A process for etching a pattern-masked conductor substrate anisotropically so as to obtain very high etch rates comprising adding a polymer-forming fluorocarbon gas and an etch gas at high flow rates to an etch chamber at etching pressures of 77 millitorr to 100 Torr using a high source power and bias power to the substrate support electrode to form a high density plasma. The gases can be added together, sequentially or alternately.

13 Claims, 2 Drawing Sheets

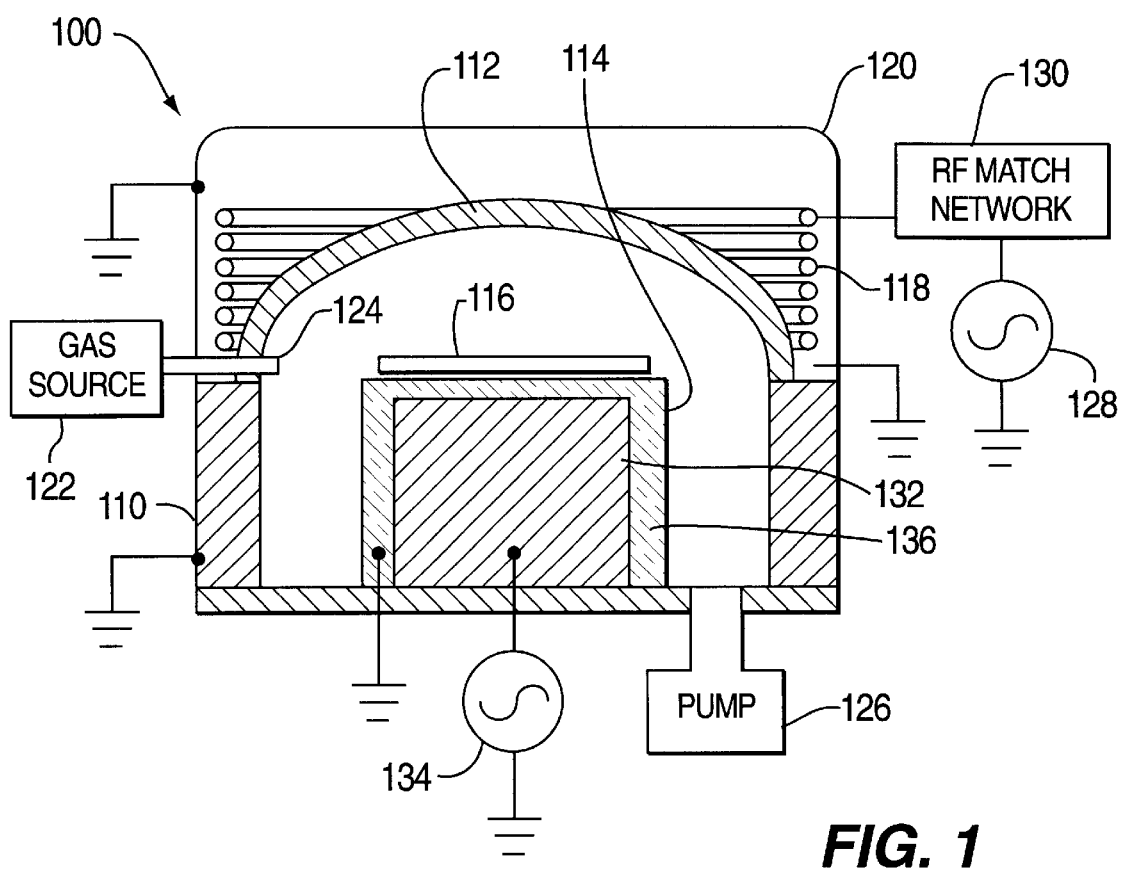
FIG. 1
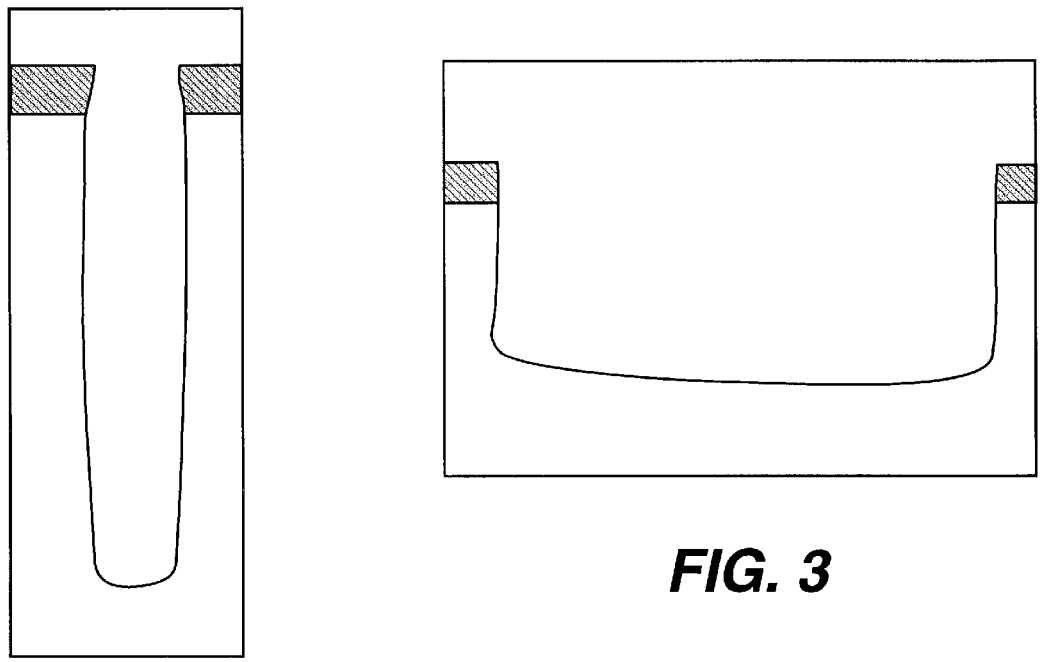
FIG. 2
FIG. 3

PROCESS FOR ETCHING CONDUCTORS AT HIGH ETCH RATES

This invention relates to a method for etching conductors at very high etch rates. More particularly, this invention relates to a high etch rate process for anisotropically etching conductors such as silicon.

BACKGROUND OF THE INVENTION

In the manufacture of semiconductor and other devices, several steps require etching of conductors such as silicon, either single crystal silicon, epitaxial silicon or polysilicon, as well as metals and metal compounds, anisotropically, at high etch rates. As an example, when making deep vertical trenches in silicon, an anisotropic etch is required; a too tapered etch profile will stop when the sidewalls converge, and any isotropic etching makes the opening difficult to fill. A fluorine-based plasma etch is convenient because high etch rates can be achieved. However, fluorine-based etchants are inherently isotropic, with the result that the sidewalls of the etched trenches are attacked, producing non-uniform sidewall profiles.

Photoresist is generally used to pattern the desired trench. When very deep trenches are to be made however, a problem arises. The etchant for silicon generally also etches the photoresist, albeit more slowly. Thus as the trench gets deeper, more photoresist is etched away as well. The silicon etch must be stopped before the photoresist pattern is removed in order to maintain the desired patterning; this frequently limits the depth of the etch. It is known to choose an etchant, such as HBr, that will deposit polymeric material on the sidewall of the etched trench to protect it and to maintain anisotropy. However, HBr is a highly corrosive etchant which can attack the walls and fixtures of the etch chamber.

Thus the present invention seeks to achieve a desired anisotropic etch of silicon at high etch rates.

SUMMARY OF THE INVENTION

The etch process of the invention employs a first fluorine-containing etch gas and a second gas that forms a polymer that can protect the photoresist and etched sidewalls. The process anisotropically etches a photoresist masked conductor substrate at very high etch rates and also obtains very high selectivity to the photoresist.

These first and second gases can be used together or sequentially. The two gases can be added to the etch chamber also alternately, in any order.

During deposition, a fluorocarbon or hydrofluorocarbon gas is passed into a plasma etch chamber at low pressure using a high source power. This deposits a fluorocarbon polymer passivation layer on the sidewalls of the photoresist pattern walls, protecting the photoresist, and on the sidewalls of the developing openings in a metal or silicon-containing layer.

Using the fluorine-containing etchant, a fluorine-containing etch gas, under conditions of high source power, high pressure and using bias power to the substrate support electrode as well, provides a very high etch rate and an anisotropic etch of silicon for example. The use of two gases, one for polymer deposition and protection of the photoresist pattern and etched opening sidewalls and the second gas for metal or silicon conductor etch, results in both high etch rates and anisotropy. In addition, the selectivity between the material etched and the photoresist is very high, generally over 70.

BRIEF DESCRIPTION OF THE DRAWING

FIG. 1 is a cross sectional view of a chamber suitable for carrying out the present etch process.

FIG. 2 is a photomicrograph of a throughhole etched in accordance with the present invention.

FIG. 3 is a photomicrograph of a throughhole etched using another embodiment of the present invention.

DETAILED DESCRIPTION OF THE INVENTION

Figure 4:
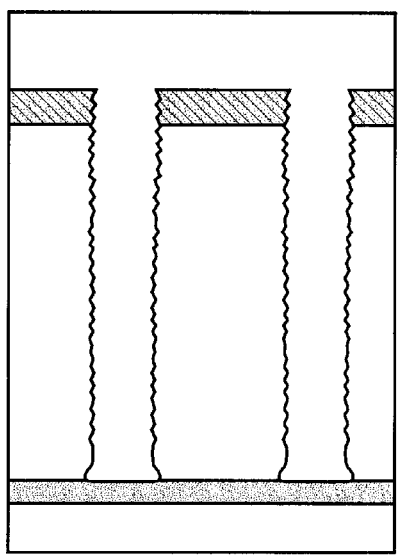
FIG. 4 is a photomicrograph of openings formed in a silicon-on-insulator (SOI) structure etched using bias pulsing.

The present etch process is used to etch conductors, including single crystal silicon, epitaxial silicon, polysilicon and metal gate or other conductor materials. The present method is useful to form deep or shallow trenches, gate structures, patterning of conductor/oxide/silicon, and silicon-on-insulator structures to form semiconductor devices including pressure sensors, accelerometers, micromirrors, optical switches, medical micro-structures and the like.

The present etch process can be carried out in a decoupled plasma source (DPS) chamber as shown in FIG. 1.

Referring to FIG. 1, an inductively coupled RF plasma reactor includes a reactor chamber 100 having a grounded conductive cylindrical sidewall 110 and a shaped dielectric ceiling 112, e.g., dome-like. The reactor includes a substrate support electrode 114 for supporting a substrate 116 to be processed in the chamber 100; a cylindrical inductor coil 118 surrounding an upper portion of the chamber beginning near the plane of the top of the substrate 116 or substrate support electrode 114 and extending upwardly therefrom toward the top of the chamber 100; a process gas source 122 and a gas inlet 124 which can be a plurality of inlets spaced about the interior of the chamber; and a pump 126 for controlling the chamber pressure. The coil inductor 118 is energized by a plasma source power supply, or RF generator 128, through a conventional active RF match network 130, the top winding of the inductor coil 118 being "hot" and the bottom winding being grounded. The substrate support electrode 114 includes an interior conductive portion 132 connected to a bias RF power supply or generator 134, and an exterior grounded conductor 136 which is insulated from the interior conductive portion 132. A conductive grounded RF shield 120 surrounds the coil inductor 118.

In accordance with one aspect of the chamber 100, uniformity of the plasma density spatial distribution across the substrate is improved by shaping the ceiling 112 as a multi-radial dome and individually determining or adjusting each one of the multiple radii of the ceiling 112. The multiple-radius dome shape in the embodiment of FIG. 1 somewhat flattens the curvature of the dome ceiling 112 around the center portion of the dome, the peripheral portion of the dome having a steeper curvature.

To carry out the present process, during the deposition step, the source power is turned on and a fluorocarbon or hydrofluorocarbon processing gas is passed into the chamber 100 from the desired gas containers (not shown). The power to the chamber 100 from the inductive RF power source 128 is suitably from about 200 up to about 3000 watts, and is preferably from about 500 to 2000 watts. The RF source can be a 12.56 MHz power source. No bias power is used during this deposition step. The pressure during this step is maintained at about 40 millitorr.

Suitable fluorocarbon gases include polymer-generating gases such as dihydrodifluoromethane ($CH_2F_2$), $C_4F_6$, $C_4F_8$ and the like. Such gases form a fluorocarbon polytetrafluorethylene-like coating on the photoresist, protecting the photoresist during the subsequent etching step. The deposition step is generally carried out for about 5 seconds.

During the etch step, silicon for example, is etched using a high gas flow of a fluorine-containing etch gas, such as sulfur hexafluoride, nitrogen trifluoride, and carbon tetrafluoride, at a pressure of between about 77 millitorr up to about 100 Torr, suitably at about 250 millitorr. The gas flow rate in the chamber of FIG. 1 is about 250 sccm, but other etch chambers may permit higher gas flow rates. During etching, a high source power of over 500 watts is used. At a pressure of 7 millitorr up to 100 torr, using a source power of about 500 to 1500 watts, an etch rate of up to about 6 microns per minute can be obtained. When a higher source power of about 1500 to 5000 watts is used, the etch rate can be 10 microns per minute or higher. A bias source power to the substrate support electrode is also turned on, conveniently at a low power of from 3 to about 1000 watts. The chamber of FIG. 1 is limited to a bias power of about 3 to 500 watts, but different etch chambers may permit higher bias power.

A frequency of about 400 kHz can be generated in the present chamber, but other frequencies can be used.

Preferably the bias power to the cathode electrode is pulsed for a period of from about 1 microsecond up to 900 milliseconds, and at duty cycles of from about 10 to 99%, to reduce charge-induced defects, such as notching, at or close to a conductor/insulator interface or a conductor/photoresist interface, for example. In particular, notching of silicon on insulator at the silicon-insulator interface can be greatly reduced using pulsed bias power during the etch step.

As a result of the high gas flow rates and high power to the source, the plasma density in the chamber is about $10^9$ ions/cm$^3$ or higher.

When the deposition and etch gases are added to the chamber alternately, the etch step is generally continued for about 10 seconds, and the deposition step for a somewhat lesser period.

The substrate can be cooled during etch processing, generally by means of a coolant passed to a channel in the substrate support electrode 114 (not shown). In addition, a flow of a coolant gas such as helium can be passed between the substrate 116 and the substrate support 114 to enhance cooling and maintain the temperature of the substrate within the desired range, generally from about 10 to about 100° C.

The present method is further explained in the following Examples. However, the details of the examples are not meant to limit the scope of the invention, which is limited only by the scope of the appended claims.

EXAMPLE 1

(This example uses an alternating two-step method)

A six inch diameter silicon wafer was patterned with a 70 micron diameter opening using a 10 micron thick photoresist layer, and using the chamber of FIG. 1. For the deposition step, a gas flow of 300 sccm of $C_4F_8$ was initiated and a source power of 1800 watts applied to the source coil. The pressure in the chamber was maintained at about 40 millitorr. A backside flow of helium at a pressure of 8 torr was maintained at the backside of the wafer to cool it. Deposition was continued for 5 seconds. This step deposited a protective coating over the patterned photoresist opening.

The fluorocarbon gas source was shut off but the power to the source coil was left on and unchanged. The pressure in the chamber was increased to 255 millitorr. To carry out the etch step, a flow of 250 sccm of $SF_6$ was started and a bias power of about 18 watts was applied to the substrate electrode. Etching was carried out for about 10 seconds.

The above two process steps were alternately repeated for 180 cycles, or for about 45 minutes. Silicon was etched anisotropically at a rate of 11.5 microns per minute. The resultant openings were 70 microns in diameter and were etched to a depth of 520 micrometers. Only 7.4 micrometers of photoresist was etched away however. Thus the silicon-:photoresist selectivity was 70. The resultant profile is shown in FIG. 2.

With proper choice of conditions, deposition of a polytetrafluoroethylene-like coating on the photoresist can produce a selectivity of over 200.

EXAMPLE 2

A silicon wafer was etched to form throughholes having a diameter of 1 millimeter. This example also used an alternating deposition and etch method.

A flow of 200 sccm of $C_4F_8$ was passed into the chamber of FIG. 1 at 25 millitorr pressure, using 1800 watts to the source coil and 1 watt to the support electrode for about 5 seconds.

The second, etch step, passed 300 sccm of $SF_6$ to the chamber maintained at 275 millitorr pressure, also using 1800 watts to the source coil and 18 watts of bias power to the support electrode for 10 seconds.

These two steps were alternated for 80 cycles (20 minutes). The resultant opening was 405 microns deep, the etch rate was 20.3 micrometers/minute with a selectivity to the photoresist of 119.

The resultant opening is shown in FIG. 3.

When there is a dielectric layer adjacent to the silicon conductor layer, there is a tendency to form a notch at the conductor-dielectric interface. This notching can be reduced by pulsing the bias source to the substrate during etching.

EXAMPLE 3

The substrate used was silicon-on-insulator. In a first deposition step, 140 sccm of $C_4F_8$ was passed to the chamber of FIG. 1 at a chamber pressure of 18 millitorr, using 700 watts of source power, 1 watt to the cathode electrode, with plasma to the bias electrode left on for 6 milliseconds and shut off for 12–13 milliseconds, a 35% duty cycle, for five seconds.

The etch step was carried out by passing 150 sccm of $SF_6$ at a chamber pressure of 18 millitorr, 700 watts of source power and 20 watts peak power to the support electrode, using plasma on time of 6 microseconds and off time of 10–13 seconds, for 10 seconds.

These steps were repeated sequentially for 48 cycles. The resultant openings are shown in FIG. 4, which shows very anisotropic etched openings, with only a slight isotropy at the silicon-insulator interface after a 50% overetch.

EXAMPLE 4

Figure 5:
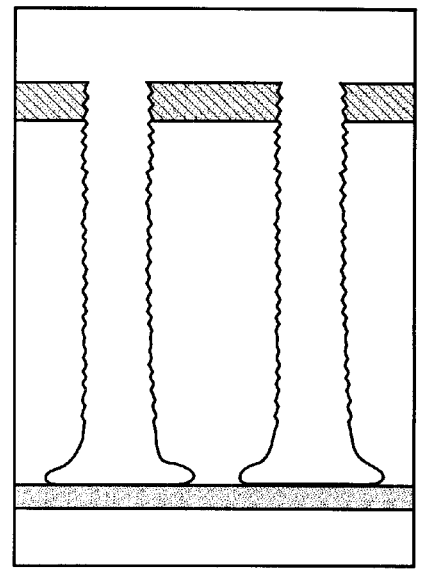
FIG. 5 is a photomicrograph of openings formed in a silicon-on-insulator structure etched without bias pulsing.

The procedure of Example 4 was followed except without using pulsing to the substrate electrode. The average bias power was the same as in Example 3. Again, after a 50% overetch, deep, straight walled openings were formed, but with somewhat more isotropy at the silicon-insulator interface, as shown in FIG. 5.

The above two-step process can eliminate the need for a hard mask, or silicon oxide mask, which reduces the number of steps of the process, eliminating deposition and patterning of the hard mask layer, and the need to remove the hard mask at the end of silicon etching.

A mixture of the deposition and etch gases can also be used, as illustrated in Example 5.

EXAMPLE 5

Figure 6:
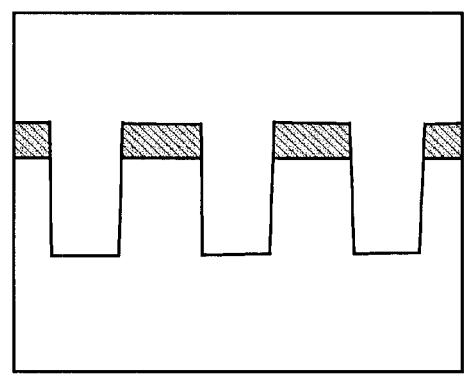
FIG. 6 is a photomicrograph of trench etched openings using still another embodiment of the present invention.

The procedure of Example 1 was followed, except that both the fluorocarbon gas and the etch gas were added at the same time. Highly anisotropic openings were formed, as shown in FIG. 6.

To further protect the sidewalls of the trench, tetrafluorosilane ($SiF_4$) can advantageously be added at a flow rate of from about 20 to 300 sccm.

Other gases, such as an inert gas such as argon, oxygen at a flow rate of from about 1 to 100% of the total flow rate, and nitrogen, also at a flow rate of from about 1 to 100% of the total flow rate, can also be added to one or both of the above gases.

The above process is applicable to the processing of various devices and features, such as optical networking, wherein an opening is etched through the silicon wafer itself, and for conventional features of semiconductor devices such as shallow trench isolation, forming gates, etching metal, as well as deep trench etching. The present process can be used also to make pressure sensors, accelerometers, micromirrors, optical switches, medical micro-structures and the like. The method can be used substituting other etch gases to etch conductors such as metals and metal compounds such as tungsten and TiN barrier layers and the like.

The present process can be carried out in a single step, or in various multistep combinations with excellent results.

The present process provides a high power, high pressure, high gas flow process that provides a very high etch rate for silicon of about 11.5 micrometers/min, to form openings having an aspect ratio of up to 7. In addition, selectivity between silicon and photoresist is very high, over 70. In the event both a photoresist and a hardmask is used, the hardmask pattern can be directly patterned from the photoresist pattern, the present high etch rate etch carried out, and the resist stripped at the end of the etch, as with oxygen, all performed sequentially in the same chamber, providing an integrated process.

The present method has been described in terms of particular embodiments, but one skilled in the art can change the etch chamber, processing conditions of temperature, pressure, power, number of process steps, length of processing time, the additives and the like and achieve like results. The method of the invention is only to be limited by the scope of the appended claims.

We claim:

1. A method of etching anisotropic openings in a conductor at a high etch rate comprising passing a fluorine-containing etch gas and a fluorocarbon polymer deposition gas to an inductively coupled RF etch chamber having a pressure of over 77 millitorr up to about 100 Torr using a source power of over 500 watts and a pulsed bias power to the cathode electrode.

2. A method according to claim 1 wherein a plasma density during etching of at least $10^9$ ions/cm$^3$ is maintained.

3. A method according to claim 1 wherein the etch rate is up to 6 microns per minute.

4. A method according to claim 1 wherein the etch rate is 10 microns per minute or higher.

5. A method according to claim 1 wherein both gases are passed to the chamber at the same time.

6. A method according to claim 1 wherein the etch gas and the polymer deposition gas are passed to the chamber sequentially.

7. A method according to claim 1 wherein the etch gas and the polymer deposition gas are alternately passed to the chamber.

8. A method according to claim 1 wherein the bias power is pulsed so as to eliminate notching at the silicon-insulator interface of silicon on insulator substrates.

9. A method according to claim 1 wherein the bias power is pulsed for a period of from 1 microsecond to about 900 milliseconds at duty cycles from about 10 to 99%.

10. A method according to claim 1 wherein additional gases selected from one or more of the group consisting of an inert gas, oxygen and nitrogen and tetrafluorosilane are passed into the chamber.

11. A method according to claim 1 wherein the conductor is silicon.

12. A method according to claim 1 wherein the conductor is selected from the group consisting of single crystal silicon, epitaxial silicon or polysilicon.

13. A method according to claim 1 wherein the conductor is a metal or a metal compound.

* * * * *